United States Patent
Shih et al.

[11] Patent Number: 6,020,249
[45] Date of Patent: *Feb. 1, 2000

[54] METHOD FOR PHOTO ALIGNMENT AFTER CMP PLANARIZATION

[75] Inventors: Tsu Shih, Chang-Hua; Jui-Yu Chang, Tao-Iuan; Syun-Ming Jang; Chen-Hua Yu, both of Hsin-Chu, all of Taiwan

[73] Assignee: Taiwan Semiconductor Manufacturing Company, Hsin-Chu, Taiwan

[*] Notice: This patent is subject to a terminal disclaimer.

[21] Appl. No.: 08/891,088

[22] Filed: Jul. 10, 1997

[51] Int. Cl.⁷ .......................... H01L 23/544; H01L 23/48
[52] U.S. Cl. .......................... 438/401; 438/694; 438/700
[58] Field of Search .................... 438/401, 694, 438/700

[56] References Cited

U.S. PATENT DOCUMENTS

| | | | |
|---|---|---|---|
| 4,893,163 | 1/1990 | Rudeck | 257/797 |
| 5,270,255 | 12/1993 | Wong | 437/194 |
| 5,369,050 | 11/1994 | Kawai | 437/62 |
| 5,401,691 | 3/1995 | Caldwell | 437/228 |
| 5,523,254 | 6/1996 | Satoh et al. | 437/62 |
| 5,733,801 | 3/1998 | Gojohbori | 438/401 |
| 5,759,921 | 6/1998 | Rostoker | 438/711 |
| 5,786,260 | 7/1998 | Jang et al. | 438/401 |
| 5,795,829 | 8/1998 | Shen | 438/694 |

Primary Examiner—Teresa M. Arroyo
Attorney, Agent, or Firm—George O. Saile; Stephen B. Ackerman

[57] ABSTRACT

A method for forming alignment marks are disclosed for performing photoalignment after chemical-mechanical polishing (CMP). A trench is first formed in a silicon substrate and then alignment marks are formed at the bottom of the trench. The aspect ratio of the trench is selected to be so low that the dishing of the CMP pad can be prevented from reaching into the trench to damage the alignment marks therein. A trench structure is also provided whereby the alignment marks can be protected from the abrasive action of the CMP. Steps subsequent to the CMP can therefore proceed unimpeded with the presence of undamaged alignment marks.

11 Claims, 12 Drawing Sheets

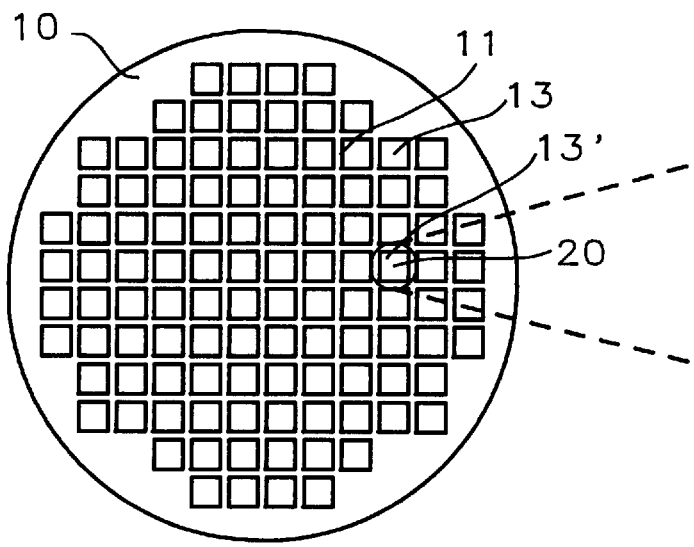
*FIG. 1a - Prior Art*
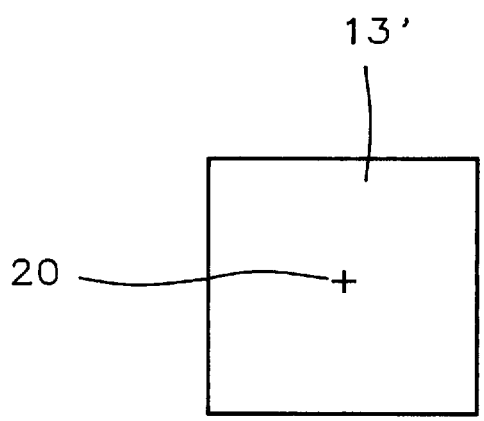
*FIG. 1b - Prior Art*

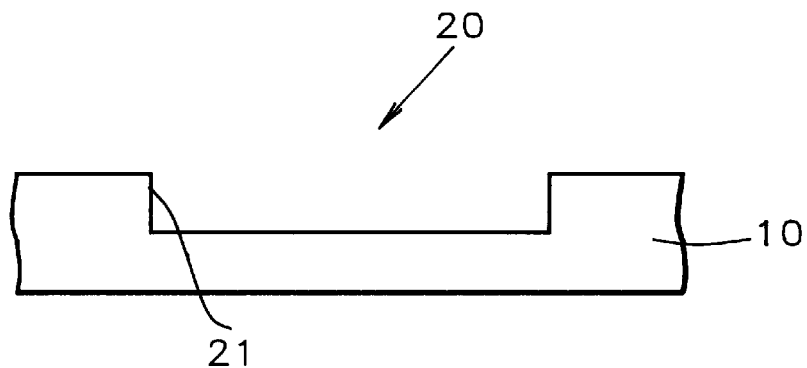
FIG. 2a – Prior Art
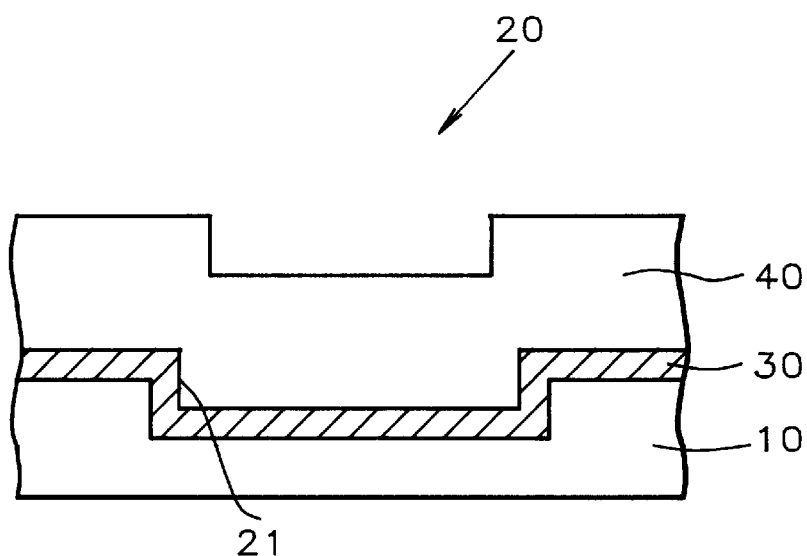
FIG. 2b – Prior Art

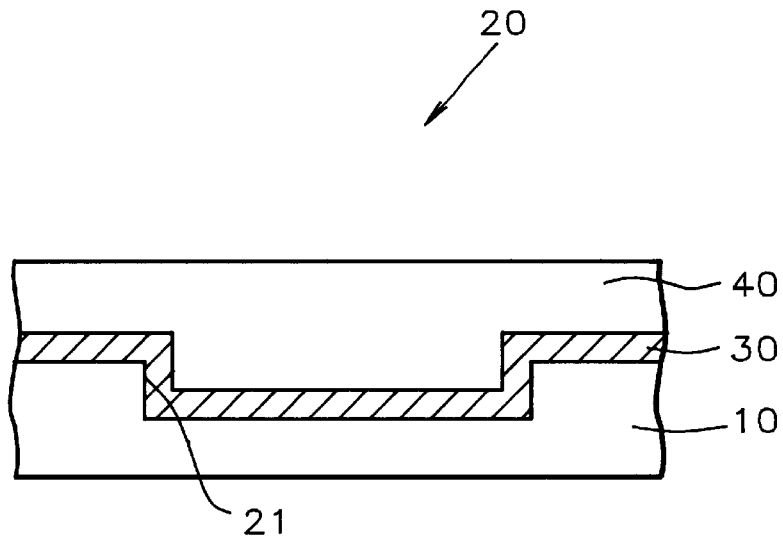
*FIG. 2c - Prior Art*
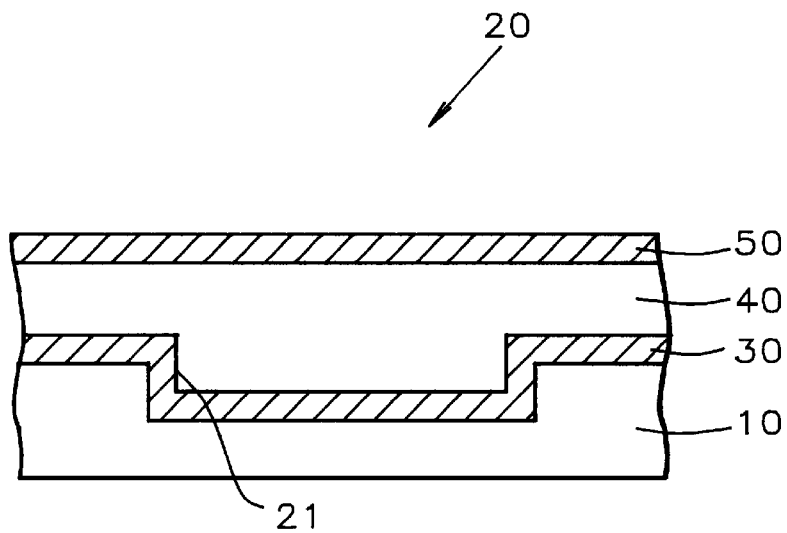
*FIG. 2d - Prior Art*

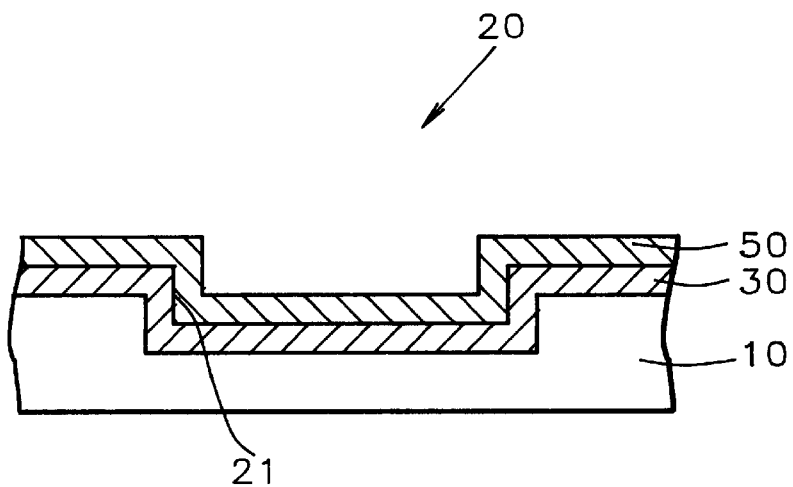
FIG. 2e – Prior Art
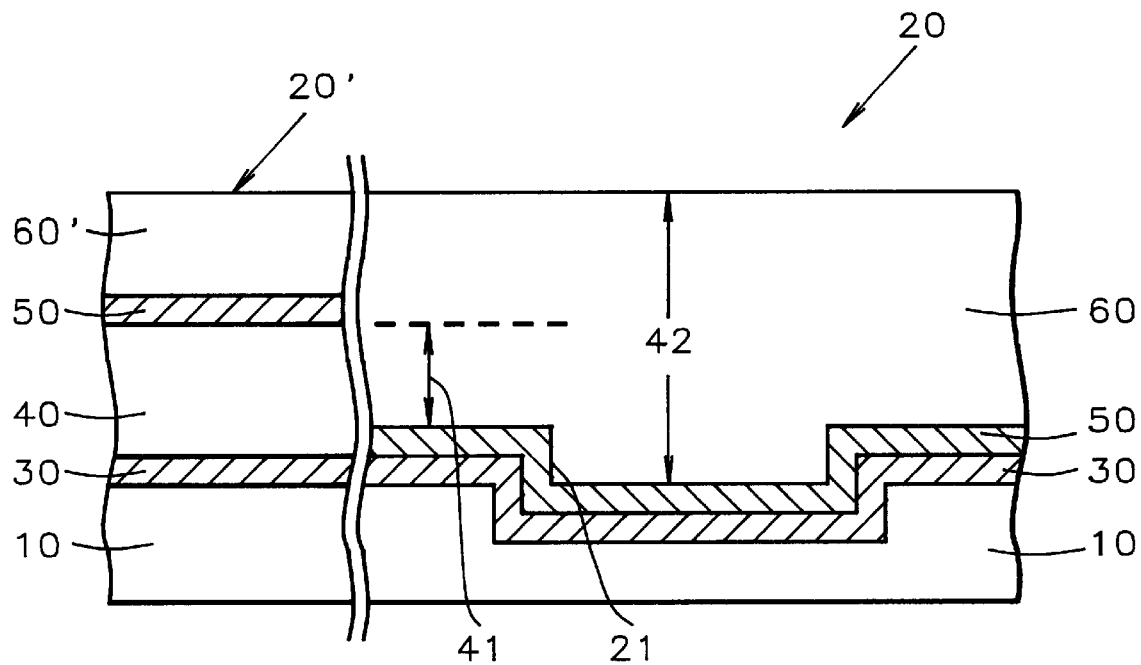
FIG. 2f – Prior Art

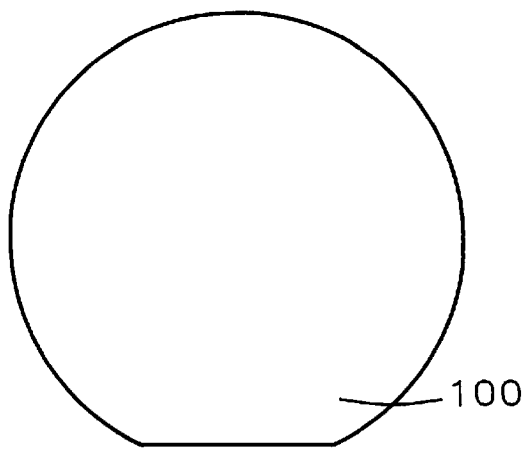
*FIG. 3a - Prior Art*
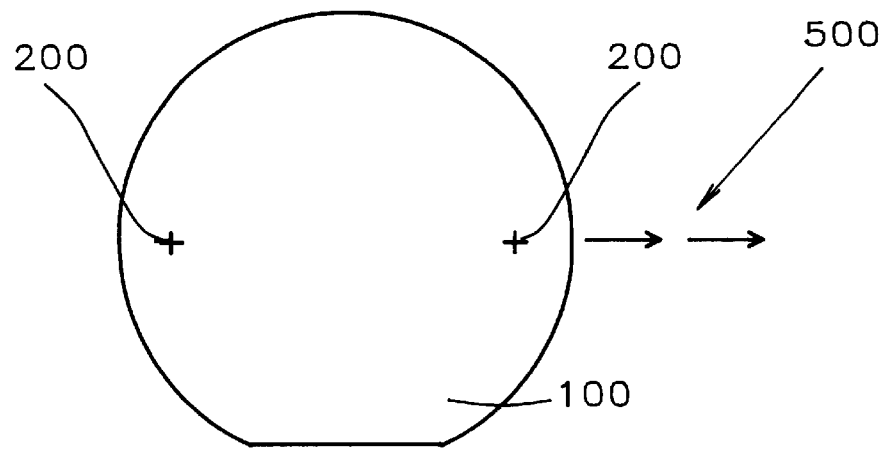
*FIG. 3b - Prior Art*

6,020,249

METHOD FOR PHOTO ALIGNMENT AFTER CMP PLANARIZATION

RELATED PATENT

U.S. patent application Ser. No. 08/867,312 filed Jun. 2, 1997 by the same inventors Tsu Shih, et al "A Method to Protect Alignment Mark in CMP Process" assigned to common assignee.

BACKGROUND OF THE INVENTION (1) Field of the Invention

The present invention relates generally to alignment process in semiconductor manufacturing, and more particularly to the forming of alignment marks for photo alignment after CMP planarization.

(2) Description of the Related Art

Alignment marks and the process of aligning alignment marks are key aspects of fabricating integrate circuit (IC) chips in the manufacture of semiconductor components. They are key because the chips themselves and the devices that go into making the chip components are fabricated by aligning many intricate layers of conductors and insulators, one upon the other, on a substrate, usually silicon. And, in the resulting structure, called a wafer, it is critical that each layer is precisely aligned with the previous layer so that the circuits formed therein are functional and reliable.

Typically, the alignment of one layer with respect to another is accomplished by means of a tool known as a wafer stepper. The wafer stepper is used to project optically a circuit pattern from a reticle mounted in the wafer stepper onto a layer formed on the semiconductor wafer. However, before the pattern on the reticle is transferred, the wafer must first be positioned or aligned precisely with respect to the reticle. Thus, a wafer ready to be patterned is loaded onto a wafer stepper. Then, using the alignment marks already on the wafer, the wafer is aligned in relation to the reticle. Once the alignment is accomplished, the remaining steps of projecting the pattern on to the semiconductor may proceed.

As is well known in the art, the position of the alignment mark on the wafer is commonly sensed by means of a laser beam. The laser beam in the stepper is bounced off of the alignment mark to create a slonal pattern of laser light. The detraction from the mark is reflected back to sending devices in the stepper and is used as a signal to measure the exact position of the alignment mark. It is to be noted that the sensed quality of the defractive light from the alignment mark is directly dependent upon the integrity of the structure of the alignment mark. The present invention is concerned with that integrity, that is, with the structure and dimensions of alignment marks, that determine how well the alignment of semiconductor wafers is accomplished.

In general, alignment marks that are formed in a wafer are subjected to the same and many process steps that the rest of the wafer experiences. The steps include deposition of conductors, insulators, etching of the same, polishing, grinding and so on. After and before each one of these steps, the alignment mark must preserve its exact dimensions and be visible to the observing beam, such as the laser beam, so that alignment of various layers with respect to the mark will always be precisely repeatable.

Alignment marks are usually of a simple geometrical shape such as a rectangle or a cross (20) as shown in FIG. 1b, and are commonly etched with a relatively shallow depth into the silicon substrate of wafer (10) shown in FIG. 1a. The position of the alignment mark is sensed by the beam as it traverses edge (21) of mark (20), better seen in the cross-sectional view in FIG. 2a. Therefore, the integrity of the edge dimension must be preserved throughout the various process steps of the wafer. The marks are formed into convenient areas on a wafer, such as a blank chip site (13') inside a kerf (11), that is, inside trench like lines shown in FIG. 1a that are scribed on a wafer around the perimeter of each chip site (13). The chips later on are broken off at the kerfs to separate them into individual components. When relatively thin and conformable materials such as oxides are deposited on a wafer, the alignment marks are also deposited with the material. However, because the deposited material is conformal, the exact shape and depth of the alignment mark is replicated. Consequently, the alignment beam can sense the exact step of the edge and hence the alignment mark. Even when the wafer is polished flat, as long as the material—such as the well known interlevel dielectrics, ILD—is transparent to the beam, the alignment mark in the layer below can still be seen and recognized. There are times, however, when materials, such as conductor metals, that are opaque to the observing beam are deposited over polished flat ILDs. In that case, the alignment mark is hidden below the metal layer and cannot be reckoned by the alignment system. Methods for circumventing these kinds of situations must be found, and though there are a few such prior art methods, not all of them address some unique problems that arise in the manufacture of semiconductor wafers, as discussed later.

In U.S. Pat. No. 5,401,691, Caldwell describes well some of the common problems encountered in prior art techniques of generating alignment marks and aligning wafers. Following his description, an alignment mark is generally formed by etching a predetermined depth into the semiconductor 10, as shown in FIG. 2a. The etching process forms a step height (21) in wafer (10). Step height (21) acts as the alignment mark and is usually chosen to be some multiple of the wavelength of the laser light used by the stepper to conduct alignment. As is pointed out in U.S. Pat. No. 5,401,691, by utilizing an alignment mark which is ¼ multiple of the laser wavelength, the signal to noise ratio of the laser detraction is optimized, resulting in optimum alignment precision.

Next, the conventional steps of fabricating a semiconductor wafer are continued. Thus, subsequent layers used to form the integrated circuit are grown and deposited. For example, in FIG. 2b, polysilicon conductor is deposited over the wafer as shown in FIG. 2b. This step usually follows the growing of field isolation regions (not shown) elsewhere on the wafer where IC devices are formed. The polysilicon layer is then covered with the deposition of an ILD layer (40). Although the original alignment mark (20) is covered by subsequent layers, the step height (21) and therefore, the alignment mark (20) is replicated in the subsequently deposited layers. The replicated alignment marks are used for aligning and patterning the subsequent layers. That is, as more layers are added to the IC, the step height of the alignment mark is propagated upward or is "built upward" with subsequent layers. The step height of the alignment mark is therefore preserved in subsequent layers so that alignment of subsequent layer can be accomplished.

A problem that is well recognized with building up the alignment mark is its incompatibility with global planarization techniques, such as chemical-mechanical polishing (CMP). As more and more layers are added to the wafer manufacturing process, and circuit density increases, the requirement to planarize the wafer topography at intermediate steps in the process becomes essential. As is well known in the art, it is important to planarize surfaces of multilevel integrated circuits because nonplanar surfaces interfere with the optical resolution of subsequent photolithography processing steps. This makes it extremely difficult to print high resolution lines, as pointed out by Caldwell. Additionally, nonplanar surface topographies can effect subsequently formed metal layers. If a step height is too large, there is a serious danger that open circuits will be formed in later metal layers. It has been found in prior art that the best way to planarize the wafer topography is to planarize the ILDs and to use a global planarization technique, such as CMP. Global planarization techniques planarize the entire wafer surface and make the surface essentially flat. Unfortunately, when ILD (40) in FIG. 2b is globally planarized, ILD all over the wafer including that which is over the alignment mark (21) is also planarized. The global planarization technique, therefore, removes the alignment mark replicated in ILD (40), as shown in FIG. 2c.

Although the alignment mark has been removed during the global planarization step, the next process step, which is typically a contact etch step, can still proceed because the alignment mark (21) is visible through the transparent ILD (40). That is, the contact etch pattern step can be aligned to the step height formed in polysilicon layer (30).

Following Caldwell, the next step in the fabrication of ICs typically is the formation of metal interconnects. As shown in FIG. 2d, a metal layer (50) is blanket deposited over ILD and into contact holes (not shown) in the wafer. Because metal layers are opaque, the step height (21) of alignment mark (20) formed in polysilicon layer (30) is invisible to the stepper laser. Without a visible alignment mark or an alignment mark replicated in metal layer (50), it is impossible to align the reticle to generate the metal interconnection pattern.

One solution to the planarized alignment mark problem is an "open frame" process as described by Caldwell. In an open frame process, after contact alignment, a separate reticle (an open frame reticle) is used to expose the area immediately surrounding alignment mark (20). ILD (40) over alignment mark (20) can then be etched away during the contact etch. Metal layer (50) can then be formed over uncovered alignment mark (20) formed in polysilicon layer (30), as shown in FIG. 2e. Alignment mark (20) recaptured and replicated in metal layer (50) can now be used to align the reticle to generate the metal interconnect pattern.

Because the ILD over the alignment mark (20) is removed during the contact etch step of the "open frame" process described above, it will be appreciated that the elevation of second metal (50) over the alignment mark area (20) will be lower than the elevation of the same second metal (50) extending to other IC areas (20') of wafer (10). The difference in the elevation between the alignment mark area (20) and other areas (20') is depicted with numeral (41) in FIG. 2f. Thus, as is seen in the same FIG. 2f, the ILD that is present between metal layers (30) and (50) in other areas on the wafer is missing over the alignment mark area. When a next layer of ILD (70) is deposited and then globally planarized, in comparison with other areas (20') on the wafer, the total thickness (42) of the dielectric material over the alignment mark area (20) will be increased by the amount (41) that was etched during the first "open frame" process. If one were to use a second "open frame" process now to open the alignment mark (21) below, it is clear that the structures such as shown in areas (20') will not be able to withstand the additional etching required to reach down to the alignment mark (21) as shown in FIG. 2f. In other words, critical areas in other parts of the wafer would be overetched. Hence while "open frame" process is useful in recapturing an alignment mark the first time around, it is not compatible with global CMP when used subsequent times.

Just as lower elevation areas are created over alignment mark areas with the "open frame" process as described above on the one hand, higher elevation areas or "mesas", on the other hand, are created adjacent to alignment mark areas in the absence of "open frame" process. The latter process causing "mesas" will not be repeated here inasmuch as it is not necessary for the understanding of this invention. Suffice it to say that the high mesas at the edges of chip sites adjacent to the alignment mark areas slow down the polish rate of CMP causing yield losses. Caldwell circumvents the "elevation difference" problems of high "mesas" and "open frame" process by judiciously removing the ILD layers over the alignment mark areas and building upward the alignment mark with metal layers, while removing alternately the metal layers in the area immediately adjacent to the alignment mark areas. In this manner, it is possible to maintain ILD thicknesses relatively the same over the whole wafer after each chemical-mechanical polishing, thereby preventing the over etching of critical areas. At the same time, this methods also avoids the problems of high mesas. However, these methods that are disclosed in U.S. Pat. No. 5,401,691 are complex, and they require the use of several masking steps including open frame and inverse open frame reticles with the stepper. What is needed a much less complicated process where masking steps for the alignment mark are eliminated as disclosed later in this invention.

In U.S. Pat. No. 5,369,050, rather than using the alignment mark itself for alignment purposes, a groove is formed around the alignment mark. A reticle containing a mask pattern in a stepper is then aligned using the step contour provided by the groove around the alignment mark. However, the patent does not discuss the compatibility of this approach with CMP. The effects of CMP on alignment marks recovered by depositing of aluminum in stages on the marks is not addressed either in another prior art method disclosed in U.S. Pat. No. 5,270,255. In still another related art, U.S. Pat. No. 5,523,254 teaches a chemical-mechanical alignment mark where a second alignment mark is formed after a via etch nearby a first alignment mark. However, this method is different from the present invention in providing alignment marks for continuing with the subsequent steps of photoalignment after CMP planarization.

SUMMARY OF THE INVENTION

It is therefore an object of this invention to provide a method of forming alignment marks for photo alignment after CMP planarization.

It is another object of this invention to provide a method for protecting alignment marks from the abrasive effects of chemical-mechanical polishing.

It is still another object of this invention to provide a structure comprising alignment marks.

In accordance with the aforementioned objects, there is provided a method for providing a trench of a specific aspect ratio at the outer perimeter of a silicon wafer and forming alignment marks therein.

In accordance with the aforementioned objects, there is also provided a structure of a specific aspect ratio for protecting alignment marks from chemical-mechanical polishing abrasion.

BRIEF DESCRIPTION OF THE DRAWINGS

The objects and features of this invention will become apparent more readily from a reading of the description in conjunction with drawings wherein similar numerals refer to similar parts throughout the several views that follow:

FIGS. 1a and 1b are plan views of a wafer and a blank site, respectively, showing chip sites and the conventional placement of alignment marks on the wafer.

FIGS. 2a–2f are cross sectional views of a substrate showing the conventional forming and replication of an alignment mark.

FIGS. 3a and 3b are schematic drawings showing conventional steps of forming alignment marks on a wafer.

DESCRIPTION OF THE PREFERRED EMBODIMENTS

Figure 4A:
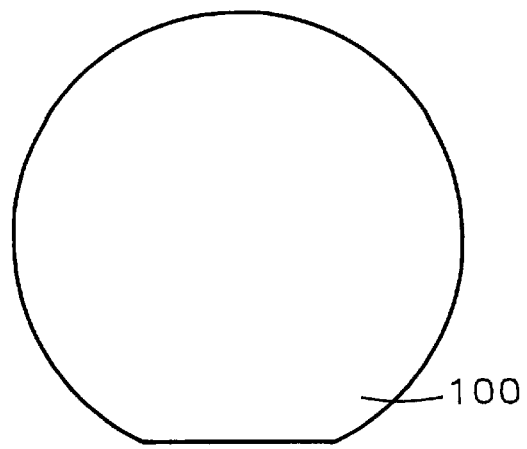
FIGS. 4a–4c are schematic drawings showing steps of forming alignment marks on a wafer according to this invention.
Figure 4B:
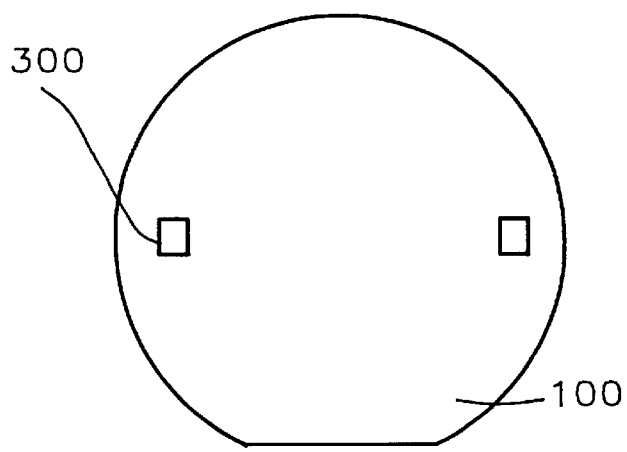
Figure 4C:
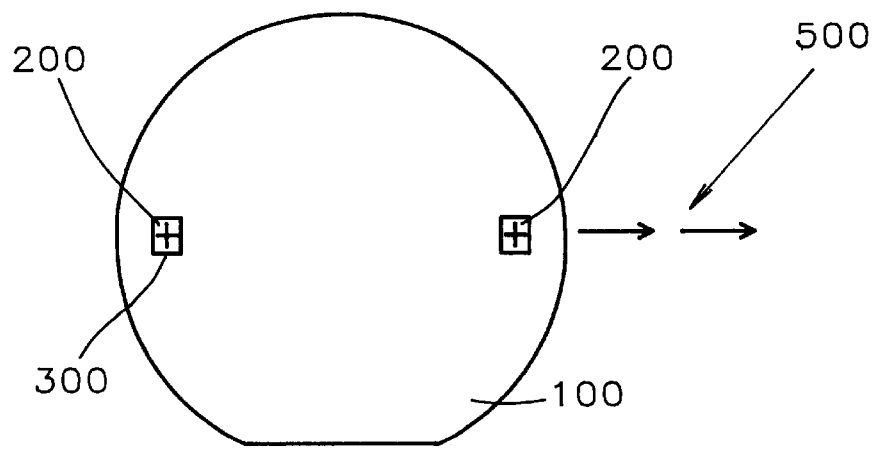

Referring now to the drawings, in particular to FIGS. 4a–4c, there are shown steps which embody the key aspects of this invention. The key aspects of the present invention are better discerned when steps in FIG. 4 are compared with those that are conventional in FIG. 3. Conventionally, a wafer (100) that has been marked or formed with alignment marks (200) as shown in FIG. 3 is subjected to further semiconductor processing steps as described earlier in related art, and represented schematically with numeral (500) in the same Figure. These include the deposition of various materials as well as the removal of the same through process means including, for example, chemical mechanical polishing (CMP) which, as stated earlier, can remove some or all of alignment marks as well. Consequently, in the partial or even total absence of the alignment marks, the subsequent steps of photoalignment are rendered difficult at best, or not possible at all.

In comparison, in the disclosed method of the instant invention, narrow trenches (300) are first formed as described below, in wafer (100) as shown in FIG. 4b. Alignment marks (200) are then formed at the bottom of these trenches shown only schematically in FIG. 4c and in detail in FIG. 7. Because of the built-in low aspect ratios of these trenches, it will be appreciated that any features formed therein will be protected from any further processes that are mechanically abrasive such as CMP. Subsequent processes (500) can then proceed unimpeded since the alignment marks will have continued building up replicatingly in the trench with each step of deposition and etching of materials following the semiconductor manufacturing processes shown in FIG. 7.

The placement of the alignment marks in trenches with a small aspect ratio, and preferably, in the outer areas of the wafer as well, help protect the integrity of the alignment marks for improved use in the subsequent photoalignment steps. The outer perimeter of the wafer is preferred because of the favorable polishing action of the CMP polishing pad (not shown). The wafer rotates against the pad while the pad is being held perpendicular to the plane of the wafer. It is found that the pad exerts most pressure centrally with respect to the wafer though the linear velocity of the pad is greatest towards the perimeter of the wafer. The pad has a less of a tendency to bear down on the perimeter of the wafer and cause what is known in the art as "dishing", that is, a dish like depression on the surface that it is being chemically etched and mechanically abraded. The preferred location of the alignment mark (200) is to exploit this characteristic of CMP action. An added advantage of placing the marks outside of the chip areas is to increase productivity at the wafer level by providing maximum usage of wafer area for integrated circuits.

Figure 5A:
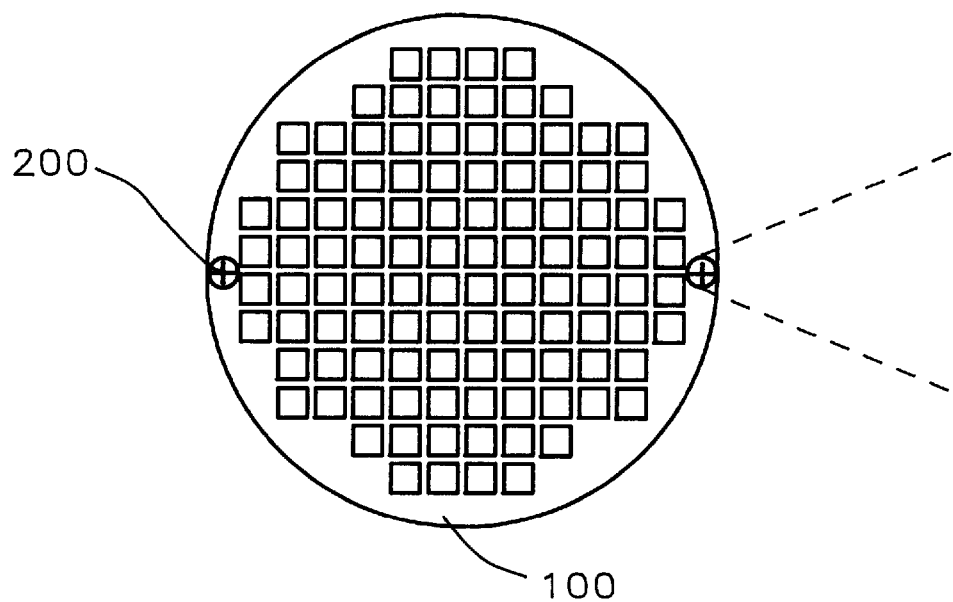
FIGS. 5a and 5b are plan views of a wafer and a peripheral site of a wafer, respectively, showing chip sites and the placement of alignment marks on the wafer according to this invention.
Figure 5B:
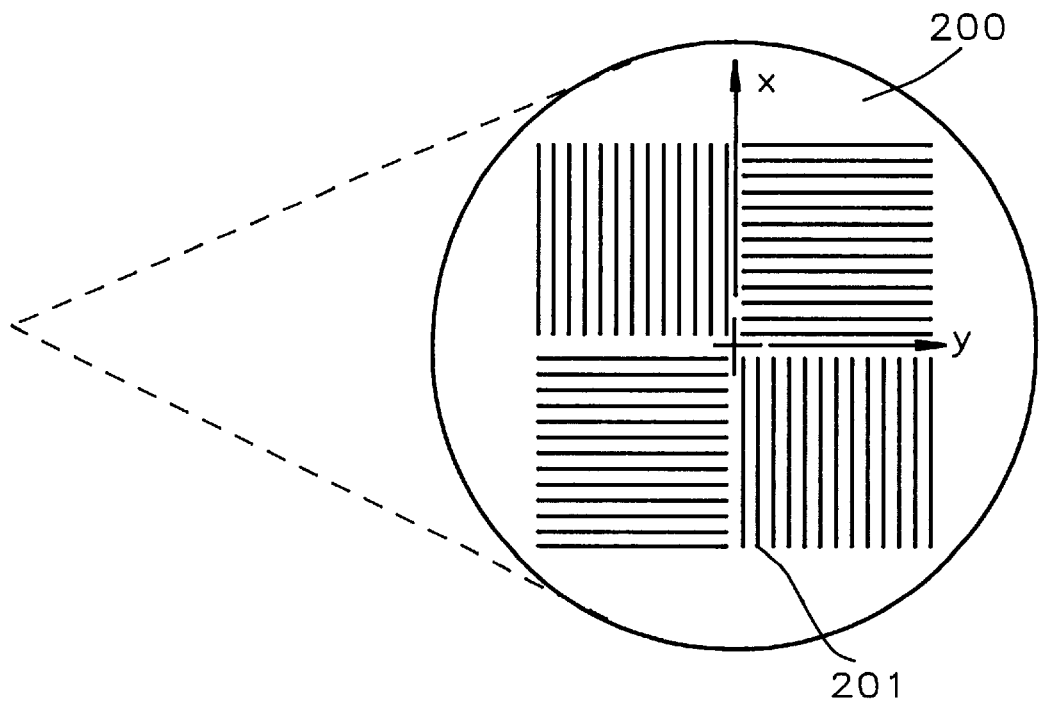

An enlarged view of alignment marks (200) is shown in FIG. 5b. Mark (200) comprises a group of grooves (201) that are alternately oriented in the x and y directions as shown in FIG. 5b. Grooves are formed into the silicon substrate of wafer (10) by plasma etching to a depth between about 1,200 to 1,300 angstroms (Å). They are preferably of width between about 7 to 8 $\mu$m, and length between about 170 to 180 $\mu$m. Thus in the first and third quadrants, a group of 13 lines are oriented in the x-direction, while a second group of 13 lines are oriented in the y-direction. In the preferred embodiment, two sets of periodicity are used in the spacing of the lines; namely, 8.0 micrometers ($\mu$) in the x-direction and 8.8$\mu$ in the y-direction. Other arrangements, and other groups with different number of lines can also be used to form any desired type of alignment marks.

Figure 6A:
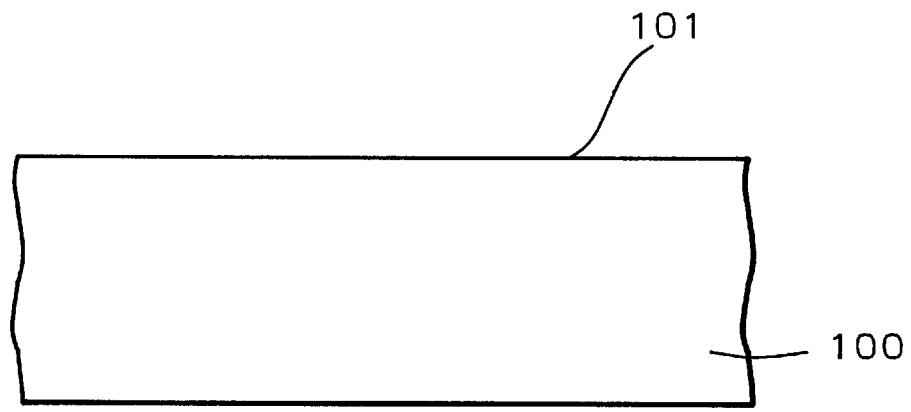
FIGS. 6a–6c are cross sectional views of a substrate showing the forming and abrasion of an alignment mark during chemical-mechanical polishing.
Figure 6B:
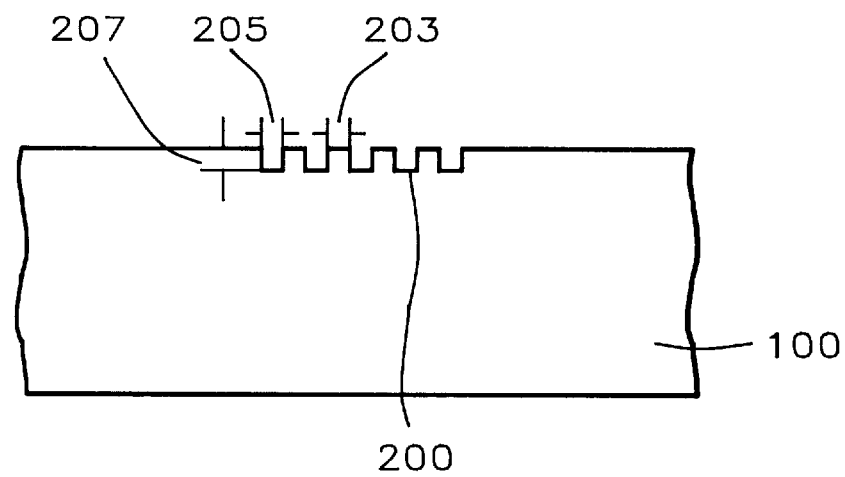
Figure 6C:
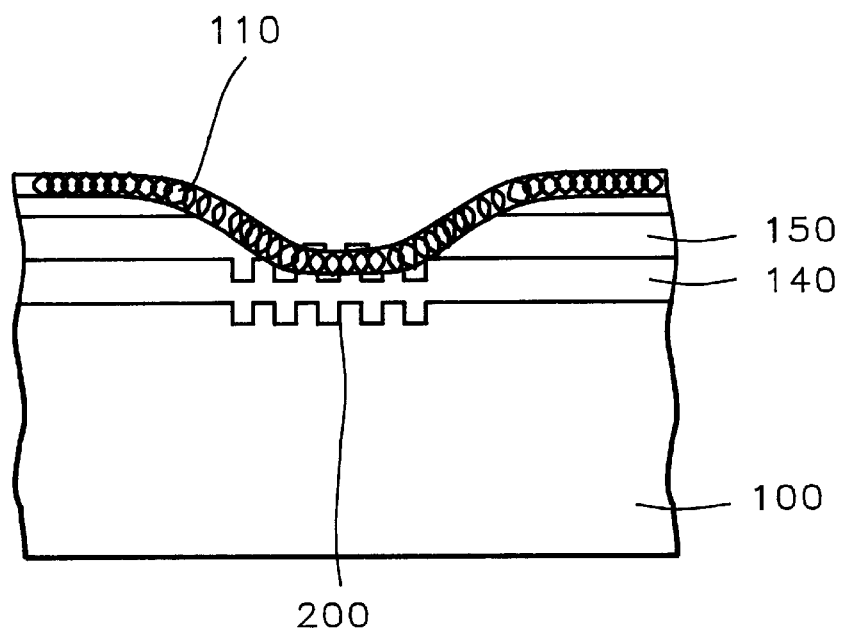

FIGS. 6a–6c depict how alignment mark (200) formed on silicon surface (101) on wafer (100) can be damaged by the polishing action of CMP polishing pad (110). It has been observed in current practice that even when the alignment marks are formed in shallow areas that are etched into silicon substrate (100), the CMP pad can cause "dishing" as shown in FIG. 6c. This enables the pad to reach down and abrade the alignment marks. It will be apparent to those skilled in the art that the intermediate steps in arriving at the chemical-mechanical polishing step were not given in order not to obscure the main point of the obliteration of alignment marks during CMP. The usual steps comprise the growing of oxide, depositing and patterning of polysilicon and the forming and polishing of the interlevel dielectric layer. In one particular experiment, tungsten was deposited and the CMP polished. The alignment marks were damaged and the next process step could not be carried out.

Figure 7A:
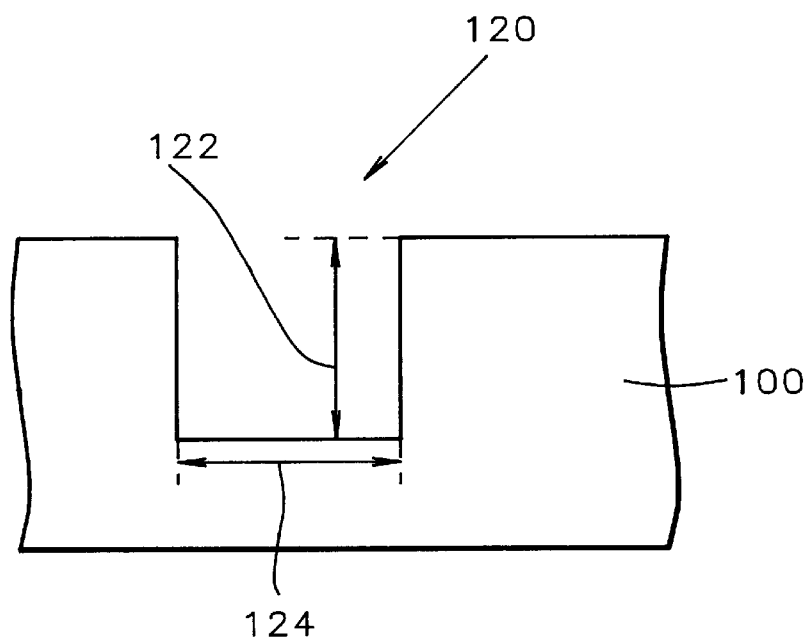
FIGS. 7a–7f are cross sectional views of a substrate showing the forming of a trench and alignment marks therein according to this invention.
Figure 7B:
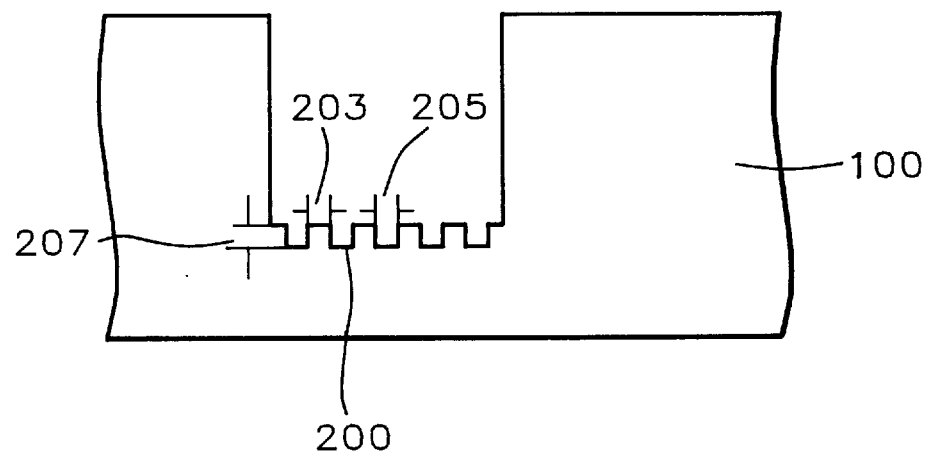

However, in the preferred embodiment of FIGS. 7a–7f, "dishing" is no longer a problem. In FIG. 7a, before the alignment marks are etched, that is, before any wafer processes have been performed, trench (120) is first formed in silicon wafer (100). A main feature and key spirit of the present invention is the narrow opening of trench (120) in silicon which prevents the CMP pad from reaching into the opening and destroying the alignment mark (200). It is preferred that the width (124) and depth (122) of the trench are, respectively, between about 1.5 to 1.7 mm, and between about 1 to 5 $\mu$m. This is accomplished by an etch recipe comprising chlorine, bromine and fluorine containing gases such as $Cl_2$, HBr and $CF_4$ at a flow rate, respectively, between about 10 to 30 sccm, 80 to 120 sccm and 10 to 30 sccm. Alignment marks (200) are then formed at the bottom of the trench as shown in FIG. 7b. Any suitable set of geometrical marks can be employed although marks (200) embodied in FIG. 5b as specified above are preferred. Preferred width (203) and depth (205) are, respectively, between about 7 to 8 $\mu$m and between about 0.12 to 0.13 $\mu$m. It will be appreciated that with a trench depth (122) to alignment mark depth (207) ratio of between about 7.7 to 41.7, the abrasive CMP pad is prevented from reaching down into the trench to obliterate the alignment marks formed therein.

Figure 7C:
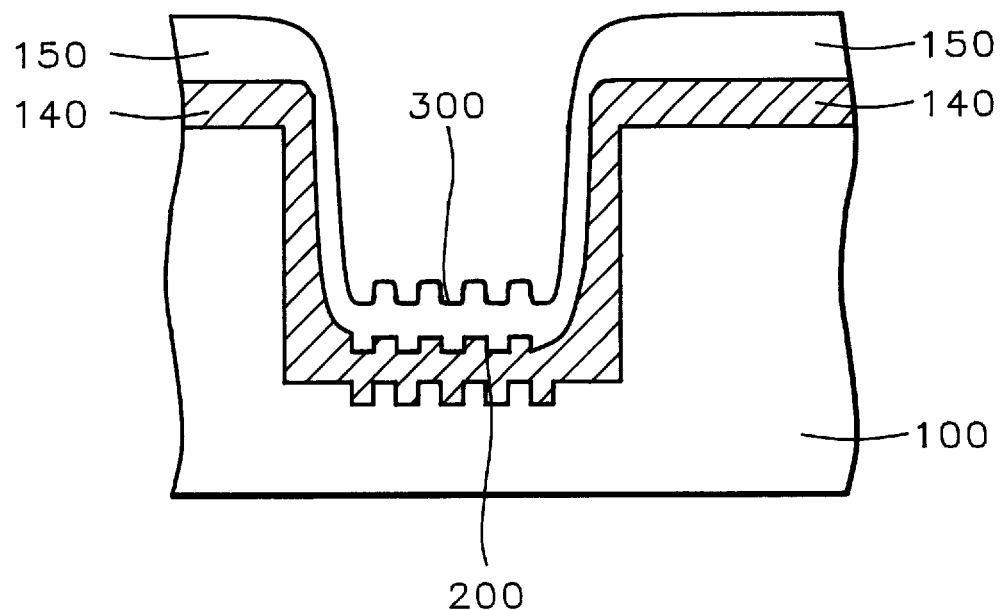
Figure 7D:
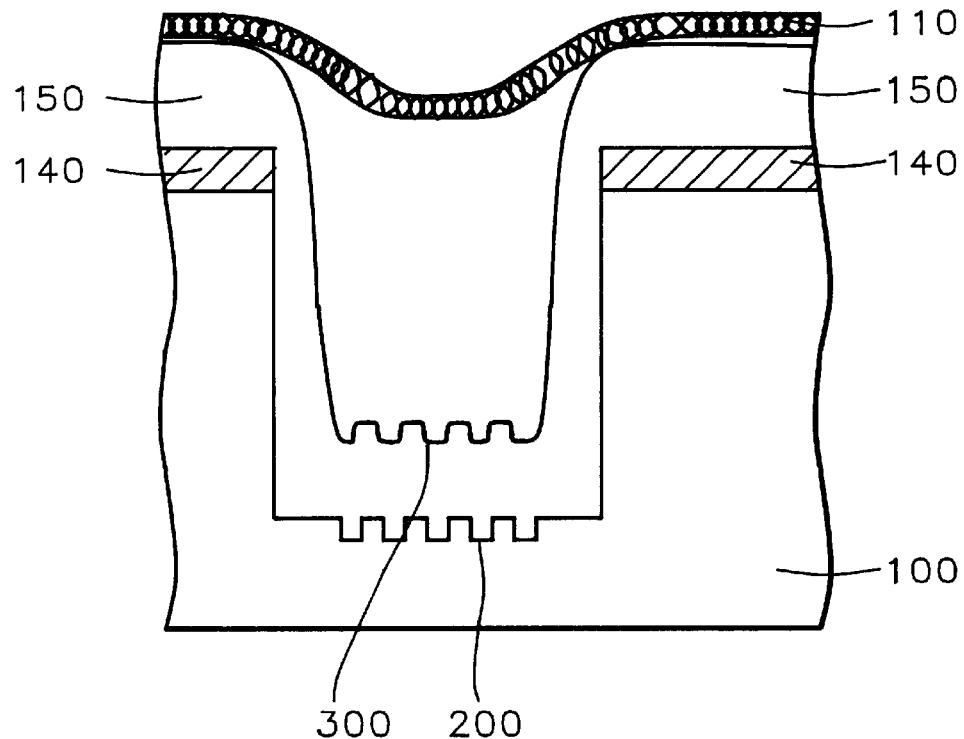
Figure 7E:
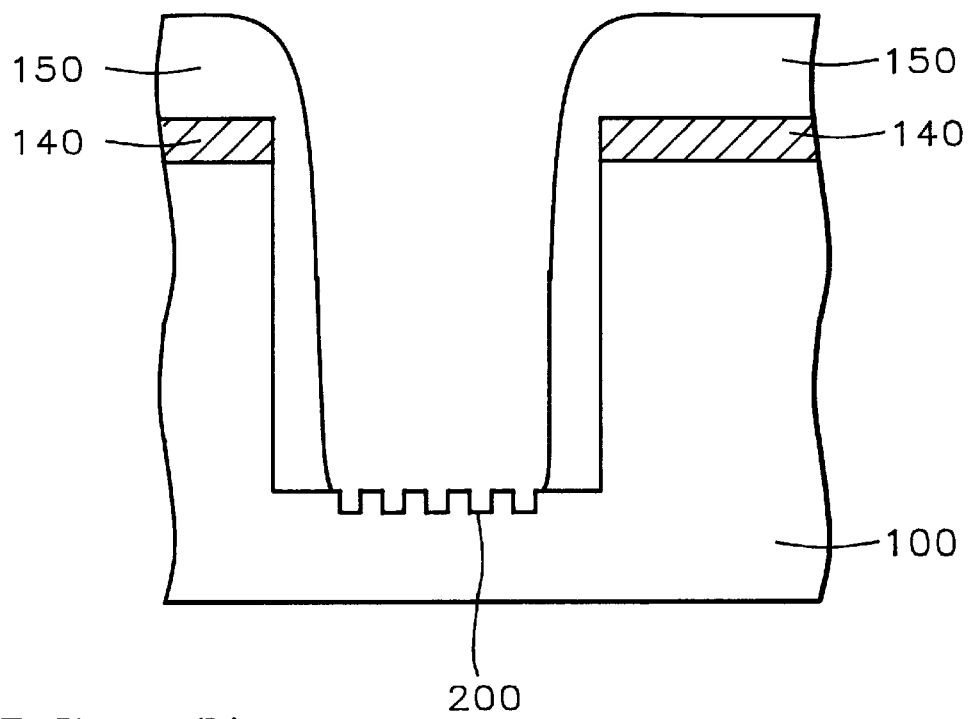
Figure 7F:
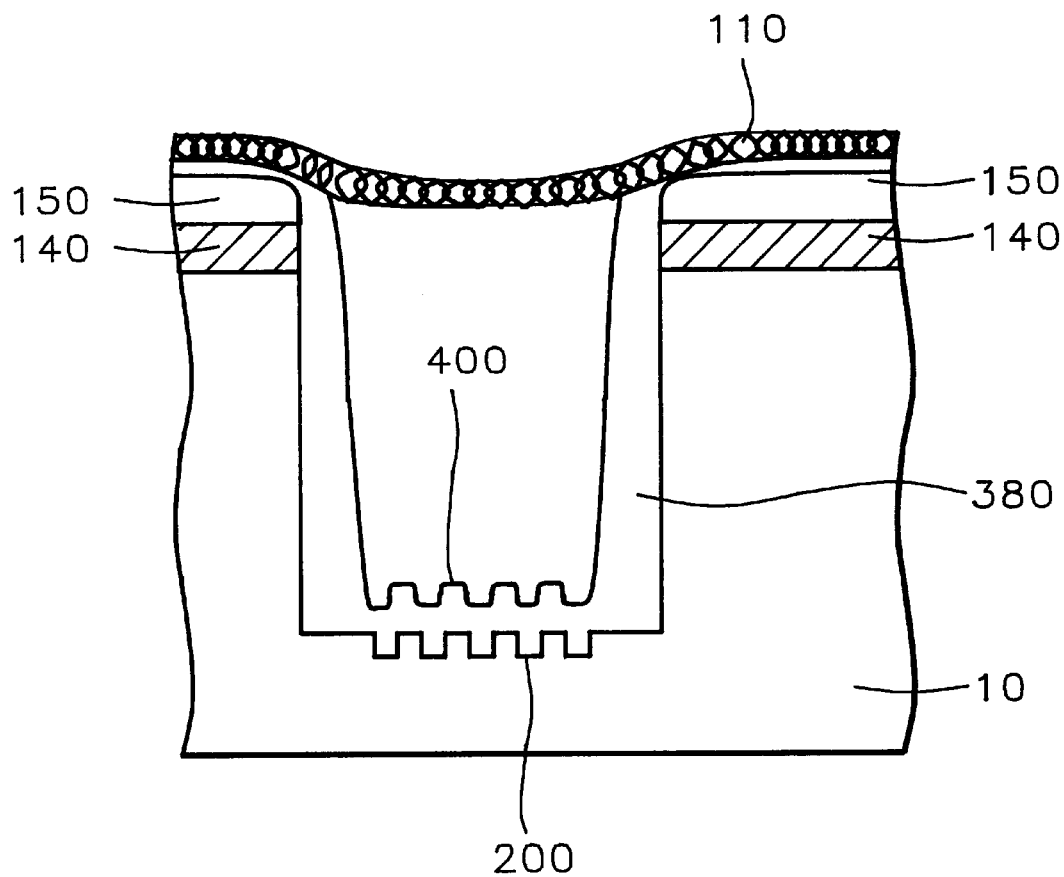

With the trench/alignment mark depth ratio of between about 7.7 to 41.7 given above, and with the preferred location of alignment mark at the perimeter of wafer (100), it has been found that the step height of alignment mark (200) is replicated throughout the subsequent total wafer fabrication process. Thus, in FIG. 7c, polysilicon conductor (140) is deposited over the wafer. This step usually follows the growing of field isolation regions (not shown) elsewhere on the wafer where integrated circuit devices are formed. After patterning, the polysilicon layer is then covered by the deposition of an interlevel dielectric ILD (150). As seen in FIG. 7c, the step heights of alignment mark (200) are replicated (300) in the ILD (150). In order to planarize the ILD, global planarization technique CMP is used. It will be observed in FIG. 7d that CMP pad (110) "dishes" to some extent at the mouth of the trench, but not sufficient enough to reach down to alignment mark steps (300). Thus alignment is possible for the next step of performing oxide etching, which is shown in FIG. 7e. Next, metal (380) is deposited which replicates the alignment mark. Subsequent CMP polishing with pad (110) does not alter the replicated structure (400) of alignment marks (200).

It is disclosed, therefore, that with a key aspect ratio for the trench for the alignment marks and a key location at the perimeter of wafers, the detrimental effects of CMP polishing can be avoided. Furthermore, it is clear that in the absence of mechanical abrasion, the various layers of conductors and insulators will replicate the step height of the alignment marks repeatably. Alignment marks, formed on the silicon substrate as taught in this invention, therefore, will provide alignment for all layers throughout the manufacture of semiconductor wafers.

While the invention has been particularly shown and described with reference to the preferred embodiments thereof, it will be understood by those skilled in the art that various changes in form and details may be made without departing from the spirit and scope of the invention.

What is claimed is:

1. A method of forming an alignment mark comprising the steps of:

providing a semiconductor substrate;

forming a trench in said substrate, and at the outer perimeter of said substrate;

forming an alignment mark having grooves in said trench of said substrate; and said grooves having a step depth between about 1,200 to 1,300 Å, thus forming a trench/alignment mark depth ratio of between about 7.7 to 41.7.

2. The method of claim 1, wherein said substrate is silicon.

3. The method of claim 1, wherein said trench is formed by performing dry plasma etch.

4. The method of claim 3, wherein said plasma etch recipe comprises $Cl_2$, HBr and $CF_4$ at a flow rate between about 10 to 30 sccm, 80 to 120 sccm and 10 to 30 sccm, respectively.

5. The method of claim 1, wherein said trench has a depth 1 to 5 µm.

6. The method of claim 1, wherein said outer perimeter is offset from the edge of said substrate between about 1.6 to 1.0 mm.

7. The method of claim 1, wherein said alignment mark comprises a plurality of grooves.

8. The method of claim 7, wherein said grooves have a length between about 170 to 180 micrometers (µm).

9. The method of claim 7, wherein said grooves have a width between about 8 to 8.8 µm.

10. The method of claim 7, wherein said grooves are formed by performing dry plasma etch.

11. The method of claim 10, wherein said plasma etch recipe comprises $Cl_2$, HBr and $CF_4$ at a flow rate between about 10 to 30 sccm, 80 to 120 sccm and 10 to 30 sccm, respectively.

* * * * *